United States Patent [19]

Stevenson et al.

[11] Patent Number: 5,328,585
[45] Date of Patent: Jul. 12, 1994

[54] LINEAR PLANAR-MAGNETRON SPUTTERING APPARATUS WITH RECIPROCATING MAGNET-ARRAY

[75] Inventors: David E. Stevenson, Northfield, Minn.; Geoffrey H. Humberstone, Holland, Mich.

[73] Assignee: Photran Corporation, Lakeville, Minn.

[21] Appl. No.: 989,078

[22] Filed: Dec. 11, 1992

[51] Int. Cl.⁵ ............................................. C23C 14/34
[52] U.S. Cl. ............................. 204/298.2; 204/192.12; 204/298.09; 204/298.19
[58] Field of Search .............. 204/192.12, 298.07, 204/298.09, 298.19, 298.2

[56] References Cited

U.S. PATENT DOCUMENTS

| | | | |
|---|---|---|---|
| 4,204,942 | 5/1980 | Chahroudi | 204/298.07 |
| 4,422,916 | 12/1983 | McKelvey | 204/298.22 X |
| 4,849,087 | 7/1989 | Meyer | 204/298.07 X |
| 4,855,033 | 8/1989 | Hurwitt | 204/298.09 |
| 5,171,415 | 12/1992 | Miller et al. | 204/298.02 X |
| 5,188,717 | 2/1993 | Broadbent et al. | 204/298.2 X |

FOREIGN PATENT DOCUMENTS

| | | | |
|---|---|---|---|
| 2707144 | 8/1977 | Fed. Rep. of Germany. | |
| 0282262 | 11/1988 | Japan | 204/298.2 |
| 3138360 | 6/1991 | Japan | 204/298.2 |

Primary Examiner—Nam Nguyen
Attorney, Agent, or Firm—R. Russel Austin

[57] ABSTRACT

A linear planar-magnetron sputtering cathode comprises a cathode body (22) including two side-walls (104) two end-walls (106) and a target-supporting member (102) attached to the walls. The cathode body encloses a magnet array (40) which may be moved reciprocally in at least one direction relative to the cathode body. A cooling fluid may be flowed through the target supporting member for cooling the target. A cooling fluid may also be flowed through the side-walls and the end-walls for cooling the end walls. A cooled enclosure is thus be provided for the magnet-array.

9 Claims, 12 Drawing Sheets

LINEAR PLANAR-MAGNETRON SPUTTERING APPARATUS WITH RECIPROCATING MAGNET-ARRAY

TECHNICAL FIELD OF THE INVENTION

The present invention relates generally to magnetron sputtering apparatus for in-line sputtering machines. It relates in particular to linear planar-magnetron sputtering apparatus wherein relative motion may be established between a target material to be sputtered and a magnet-array providing a magnetic field defining a sputtering zone on the target material.

DISCUSSION OF BACKGROUND ART

A linear planar-magnetron, of the type generally used in in-line sputtering machines, usually has an elongated rectangular cathode body having target material attached to a surface of the body. The cathode body includes a target-supporting member or target-backing plate for supporting a target material to be sputtered. The target backing plate generally forms one surface of a box-shaped enclosure through which water is be passed for cooling the planar-magnetron during sputtering.

The target material is positioned over a magnet-array located within the enclosure. The magnet-array usually comprises three spaced-apart, parallel rows of magnets extending along the length of the cathode body. The rows usually are arranged with outermost rows near the edge of the target material, the outermost rows providing a south magnetic pole. The outermost rows are joined at each end thereof by shorter rows of magnets also providing a south magnetic pole. An innermost row is generally located equidistant from the outermost rows and provides a north pole. The rows of magnets are arranged on a ferro-magnetic magnet-backing plate or flux-return plate.

The above-described magnet-array provides a magnetic field having the form of a continuous tunnel extending in an elongated loop over the target material. This field defines a sputtering zone on the surface of the target material. Sputtering occurs primarily in this sputtering zone with the result that the target material is preferentially eroded in this zone to provide an erosion-zone having the form of the magnetic field. This erosion-zone is generally referred to by sputtering practitioners as the "racetrack" because of its characteristic form.

The above-described linear planar-magnetron has certain well known disadvantages, for example, as sputtering occurs primarily in the racetrack, target material may be completely eroded in the racetrack area before significant erosion has occurred elsewhere on the target material. Because of this, target material must be replaced after only a relatively small fraction of it, generally between about twenty-five and thirty-five percent, has been sputtered. Additionally, concentration of sputtering in the racetrack area concentrates generation of heat in this area. This eventually limits the power at which the linear planar-magnetron can be operated and thus limits the rate at which material can be sputtered.

Another disadvantage of the above-described linear planar-magnetron is found when it is used to deposit insulating materials by DC reactive-sputtering, particularly when it is used to deposit silicon dioxide by DC reactively sputtering silicon in an atmosphere including oxygen. When depositing an insulating material, the material is deposited on the surface of the target outside the racetrack area and builds an insulating layer on the surface of the target material. The insulating layer causes charge build-up on the surface of the target material which frequently is discharged in the form of an arc. Such an arc destabilizes sputtering conditions and may cause debris resulting from the arc to be deposited on a substrate being coated.

Solutions to preferential sputtering of a planar-magnetron target have been proposed. Certain of these solutions involve relative motion between the magnet-array and the target material.

McKelvey in U.S. Pat. No. 4,422,916 describes a linear magnetron having a cylindrical cathode body including a layer of target material on the outer surface of the body. Water may be passed through the body for cooling the magnetron during sputtering. A magnet-array within the body extends along the length of the body and defines a narrow elongated sputtering zone over the target material. The cylindrical body may be rotated continuously over the magnet-array during sputtering, with the result that almost the entire surface of the target material is sputtered.

The McKelvey magnetron is generally referred to as a rotating cylindrical-magnetron. A rotating cylindrical-magnetron similar to the McKelvey magnetron is available commercially, under the trade name "C-Mag", from Airco Coating Technologies of Fairfield, Calif.

The rotating cylindrical-magnetron substantially overcomes the preferential target sputtering disadvantage of the linear planar-magnetron, however it has it is often difficult to apply target material to the surface of the cylindrical cathode body. This true in the case of a material such as silicon which can not be readily fabricated in the form of a tube. Silicon material can be applied to a cylindrical cathode body by plasma spraying powdered silicon onto the cathode body, the resulting silicon layer however is porous. A porous layer may, at least partially, disintegrate during sputtering. Such disintegration may lead, for example, to reduction of target life.

Corbani, in German Offenlegungsschrift DE 27 07 144, describes, in principle, several magnetron arrangements including relative motion between a magnet-array and a sputtering-target. The Corbani patent is directed primarily to planar-magnetron and non-planar-magnetron arrangements in which the magnet-array is significantly smaller than the target surface area. In each of the arrangements, the magnet-array is moved about the target surface area such that the whole surface may eventually be evenly sputtered, it is evident, however, that for depositing films on a large surface area these arrangements would provide only a relatively low deposition rate.

A linear planar-magnetron cathode including a moving magnet is not believed to be commercially available. In large scale in-line sputtering machines of the type used for coating architectural glazings, the magnetrons used are either fixed-magnet-array planar-magnetrons or McKelvey type rotating cylindrical-magnetrons.

A linear planar-magnetron including a moving magnet-array would be particularly advantageous for depositing silicon dioxide films at a high rate by sputtering silicon in an atmosphere including oxygen. Silicon target material could be applied to the target backing plate in the form of tiles of crystalline silicon material, and the entire area of the silicon target material could be sputtered, thus significantly reducing the arcing problem encountered when sputtering silicon using a conventional planar-magnetron. Such a device would provide the advantages of a rotating cylindrical magnetron without the disadvantage presented by a porous silicon target material A significant problem in the design of a practical moving-magnet planar-magnetron is that, for reasons of preserving reliability of bearings and seals associated with magnet-moving apparatus, the magnet-array should not located in an enclosure including cooling-water. Cooling must thus be applied within the target backing plate. A target backing plate, however, is limited in thickness, because the magnet-array must be held relatively close to the target material to provide an optimum field shape. Providing effective means for target-cooling is thus very important in developing a reliable high-deposition-rate moving-magnet linear planar-magnetron for large scale in-line sputtering apparatus.

SUMMARY OF THE INVENTION

The present invention is directed to a linear planar-magnetron sputtering cathode having a moving magnet-array for providing uniform sputtering of a target material on the magnetron.

The invention comprises a hollow, generally rectangular box-shaped cathode body. The cathode body includes a generally flat rectangular base, and a generally flat rectangular target-supporting member for supporting a target material to be sputtered. The base and the target-supporting member attached to and spaced apart by two side-walls and two end-walls.

Magnetic means are located within the cathode body for defining an elongated sputtering-zone extending along the length of the target-supporting member. The magnetic means may be moved reciprocally in at least one direction with respect to the target-supporting member.

The target-supporting member is arranged to support on an outer surface thereof a target material to be sputtered. The target material is in contact with a predetermined generally rectangular target area of the outer surface of the target-supporting member.

The target-supporting member includes means for cooling the target material during sputtering, and the side-walls and end-walls of the cathode body include cooling means for cooling the sidewalls and the end-walls during sputtering.

Together, the target-cooling means and the side-wall and end-wall cooling means provide means for cooling the magnet-array during sputtering.

In one embodiment, the target supporting member includes a generally rectangular target-cooling space having about the same area as the target area and aligned therewith. An input conduit is attached to each of the side-walls and an output conduit is attached to each of the end walls. Each side-wall includes a chamber in fluid communication with the target-cooling space and one of the input conduits. Each end-wall includes a chamber in fluid communication with the target-cooling space and one of the output conduits.

A cooling-fluid may be flowed into the target-cooling space via the input conduits and the side-wall chambers, and flowed out of the target-cooling space via the end-wall chambers and the output conduits.

In a preferred embodiment, the input conduits are located at a mid-point of the side walls and the output conduits are located at a mid-point on the end walls. This conduit arrangement causes a generally symmetrical flow of cooling-fluid through the target-cooling space from the center of the space outward toward the ends of the space.

BRIEF DESCRIPTION OF THE DRAWINGS

The accompanying drawings, which are incorporated in and constitute a part of the specification, schematically illustrate a preferred embodiment of the invention and, together with the general description given above and the detailed description of the preferred embodiment given below, serve to explain the principles of the invention.

DETAILED DESCRIPTION OF PREFERRED EMBODIMENTS

Figure 1:
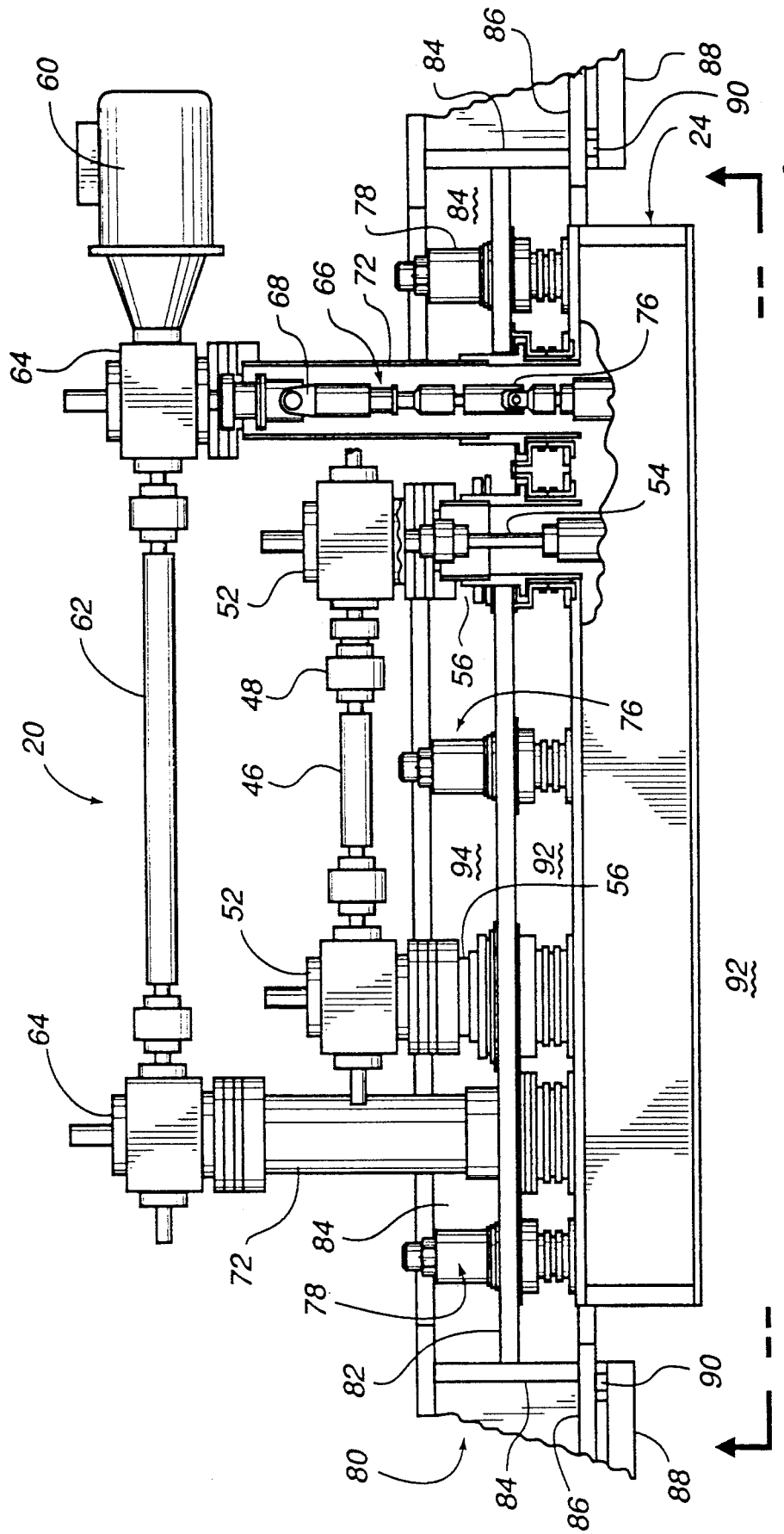
FIG. 1 schematically illustrates a side-elevation view of a linear magnetron sputtering apparatus according to the present invention.
Figure 2:
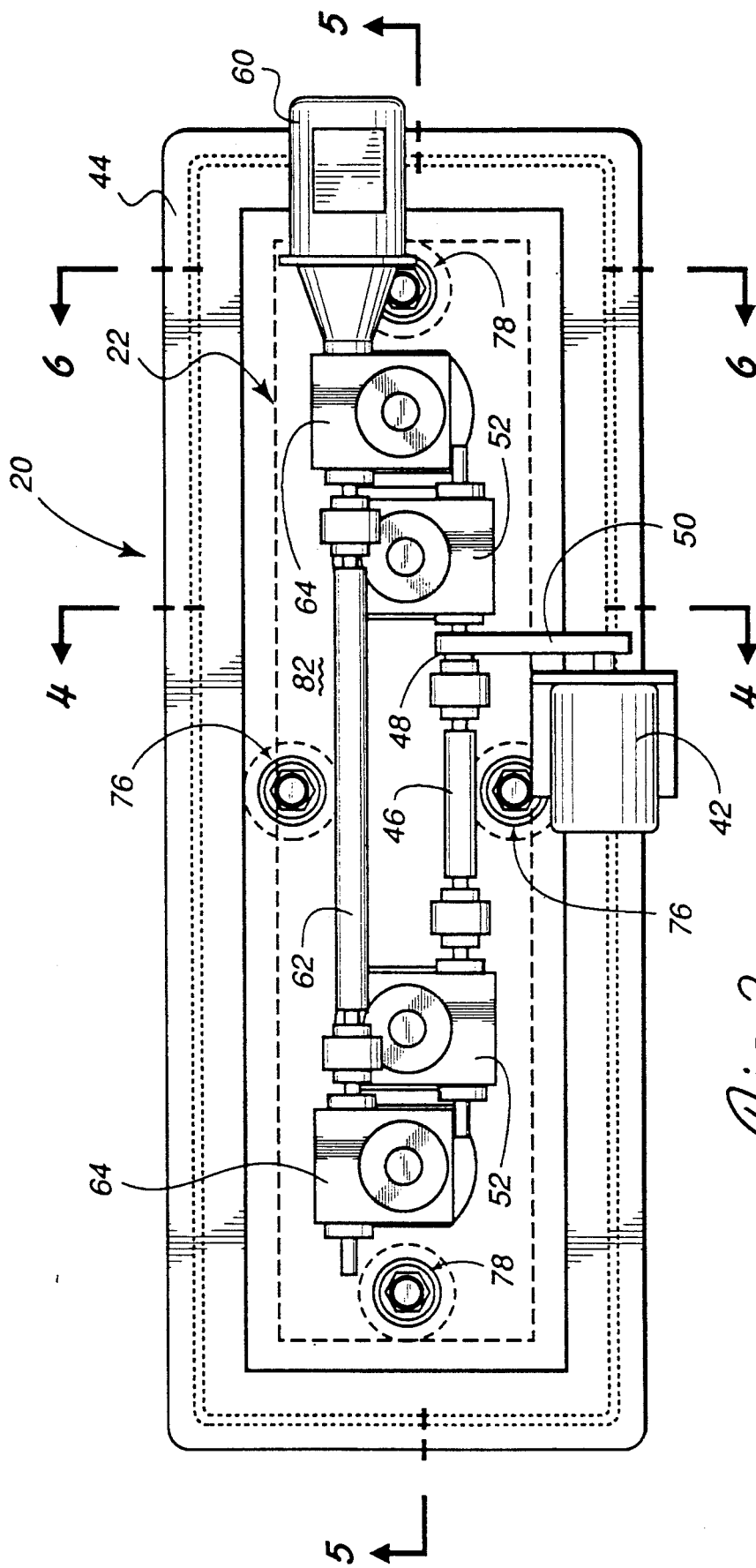
FIG. 2 schematically illustrates a plan view of the linear magnetron of FIG. 1
Figure 3:
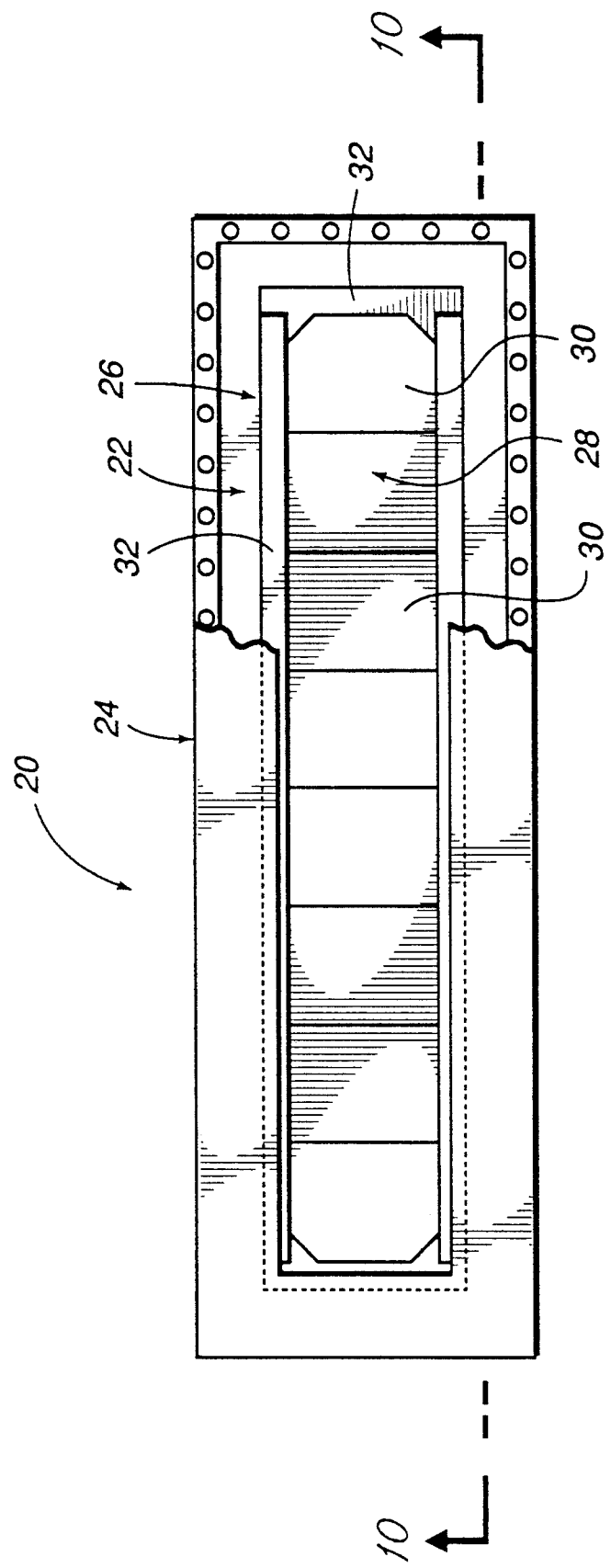
FIG. 3 schematically illustrates a view taken in the direction 3—3 of FIG. 1 showing the arrangement of a dark-space shield around the cathode of the linear magnetron.

Turning now to the drawings, wherein like components are designated by like reference numerals, FIGS. 1, 2, and 3 illustrate the general layout of a preferred embodiment of a magnetron 20 in accordance with the present invention.

Magnetron 20 includes a cathode body 22 surrounded by a dark-space shield 24 (see FIG. 3). The cathode body is indicated in phantom on by line 22 in FIG. 2. An area 26 on cathode body 22 is arranged to support a target material 28 to be sputtered. The target material may be aluminum doped silicon in the form of tiles 30 attached to the surface of cathode body 22 by tin solder. When silicon is being sputtered in a reactive atmosphere for depositing silicon dioxide, a build-up of silicon dioxide on dark-space shield 24 may cause arcing during the sputtering process. To minimize such arcing, it is convenient to arrange a strip 32 of a metal such as titanium around the perimeter of target area 26. Titanium has a significantly lower sputtering rate than silicon under the same sputtering conditions. When placed as indicated, i.e., where it at the edge of the sputtering plasma or the erosion zone of the cathode, it has been determined that it does not sputter to any detectable degree, if at all, while silicon is being sputtered. Because of this, silicon dioxide films deposited with such a cathode may include little, if any, titanium dioxide.

Figure 4:
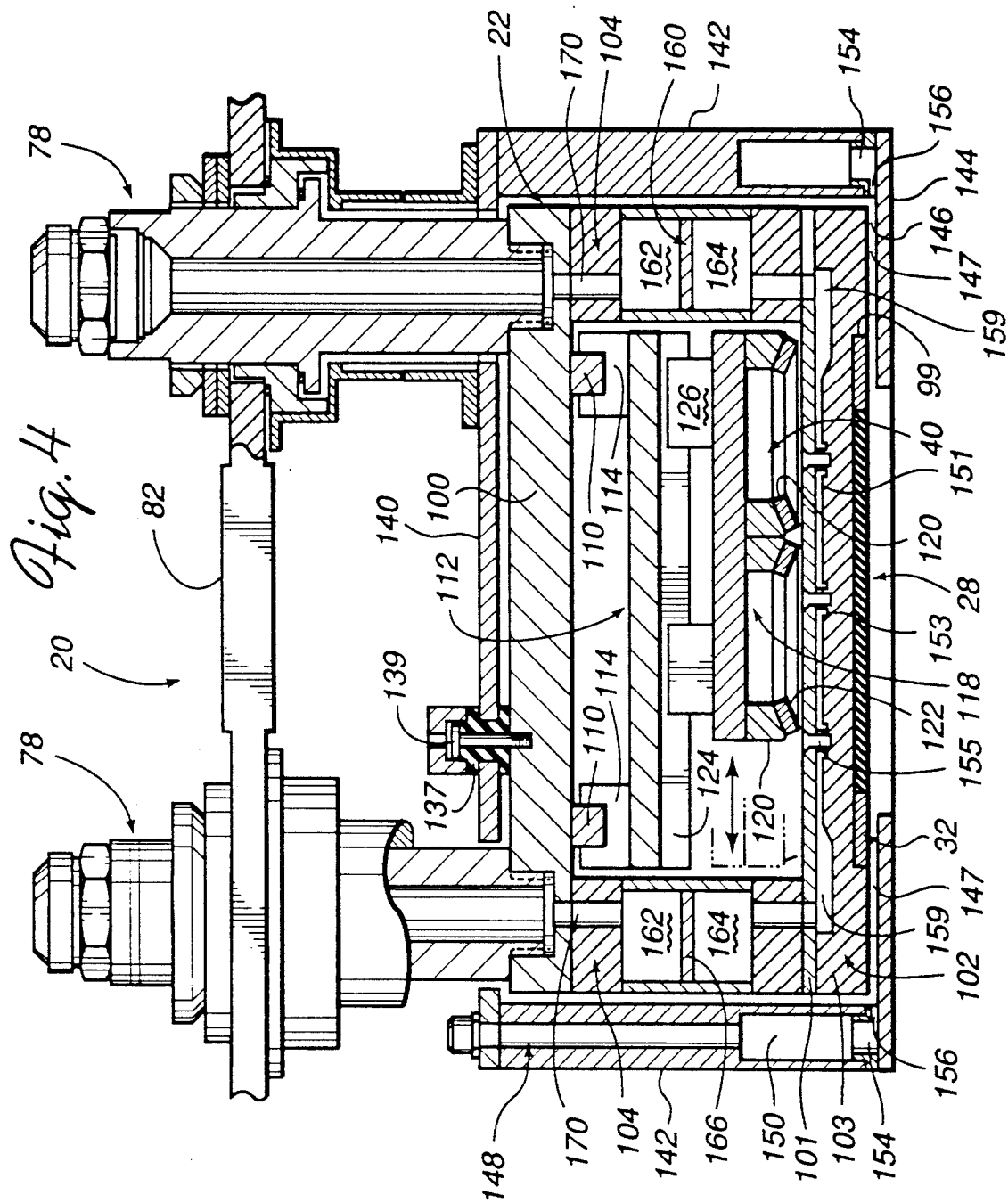
FIG. 4 is a cross-section view taken in the direction 4—4 of FIG. 2 schematically illustrating details of a linear bearing arrangement supporting a magnet-array for providing reciprocal motion of the array.

Referring to FIG. 4 for detail, magnetron 20 includes a magnet-array which may be provided with reciprocal motion to sweep a magnetic field produced by the array, over target area 26, such that essentially the entire target area is uniformly eroded during sputtering. The array may be moved reciprocally in a direction across the width of cathode body 22 but is preferably also moved reciprocally in a direction along the length of cathode body 22.

Referring again to FIGS. 1 and 2, a motor 42 (not shown in FIG. 1) provides power for driving magnet-array 40 in a direction along the length (longitudinally) of cathode body 22. The motor 42 drives a shaft 46 via a pulley 48 and a belt 50. Longitudinal-drive reduction gearboxes 52 transmit rotation of shaft 46 to shafts 54 (only one shaft 54 is visible in FIG. 2). Shafts 54 are housed in sealing tubes 56. The manner of communicating rotary force from shafts 56 to array 20 will be described in further detail below.

Continuing with reference to FIGS. 1 and 2, a motor 60 provides lateral driving force for magnet-array 40. Lateral drive from motor 60 is transmitted, via a coupling shaft 62 and reduction gearboxes 64, to shaft assemblies 66 (only one assembly 66 is visible in FIG. 2) Shaft assemblies 66 are housed in sealing tubes 72.

A cooling-fluid, such as water, is circulated through magnetron 20 via water vacuum feed-throughs housing input and output conduits 76 and 78 respectively.

A mounting unit 80 is provided for mounting magnetron 20 on a vacuum chamber such that cathode body 22 may be held under vacuum. Mounting unit 80 includes a sealing platform 82 attached to a sealing wall 84. Sealing wall 84 is shown partially cut away in FIG. 1 for clarity. Wall 84 is shown in phantom in FIG. 2. Wall 84 is attached to a mounting flange 86. Mounting unit 80 also includes an upper rim 87 mounted on wall 84. Rim 87 is used to mount longitudinal drive motor 42 on mounting unit 80 (see FIG. 2).

The primary purpose of rim 87 in conjunction with wall 84 is to stiffen mounting flange 86. Sealing platform 82 can be co-planar with mounting flange 86 if space conditions in the vacuum chamber warrant.

Flange 86 may be mounted on a wall 88 of a vacuum chamber (not shown) and sealed thereto by a seal 90. When the vacuum chamber is exhausted (under vacuum), space 92 below sealing platform 82 is under vacuum, while space 94 thereabove is at atmospheric pressure. Cathode body 22 and dark-space shield 24 are mounted on platform 82 by seals on sealing tubes 56 and 72 and on conduits 76 and 78.

Cathode body 22 provides a dry enclosure at atmospheric pressure for magnet array 40 and components for moving the magnet array. Sealing tubes 72 provide that rotary drive may be transmitted to the magnet-array without the need for rotary vacuum seals. Further details of mounting and sealing arrangements for cathode body 22 and drive arrangements for magnet-array 40 are given below.

Figure 10:
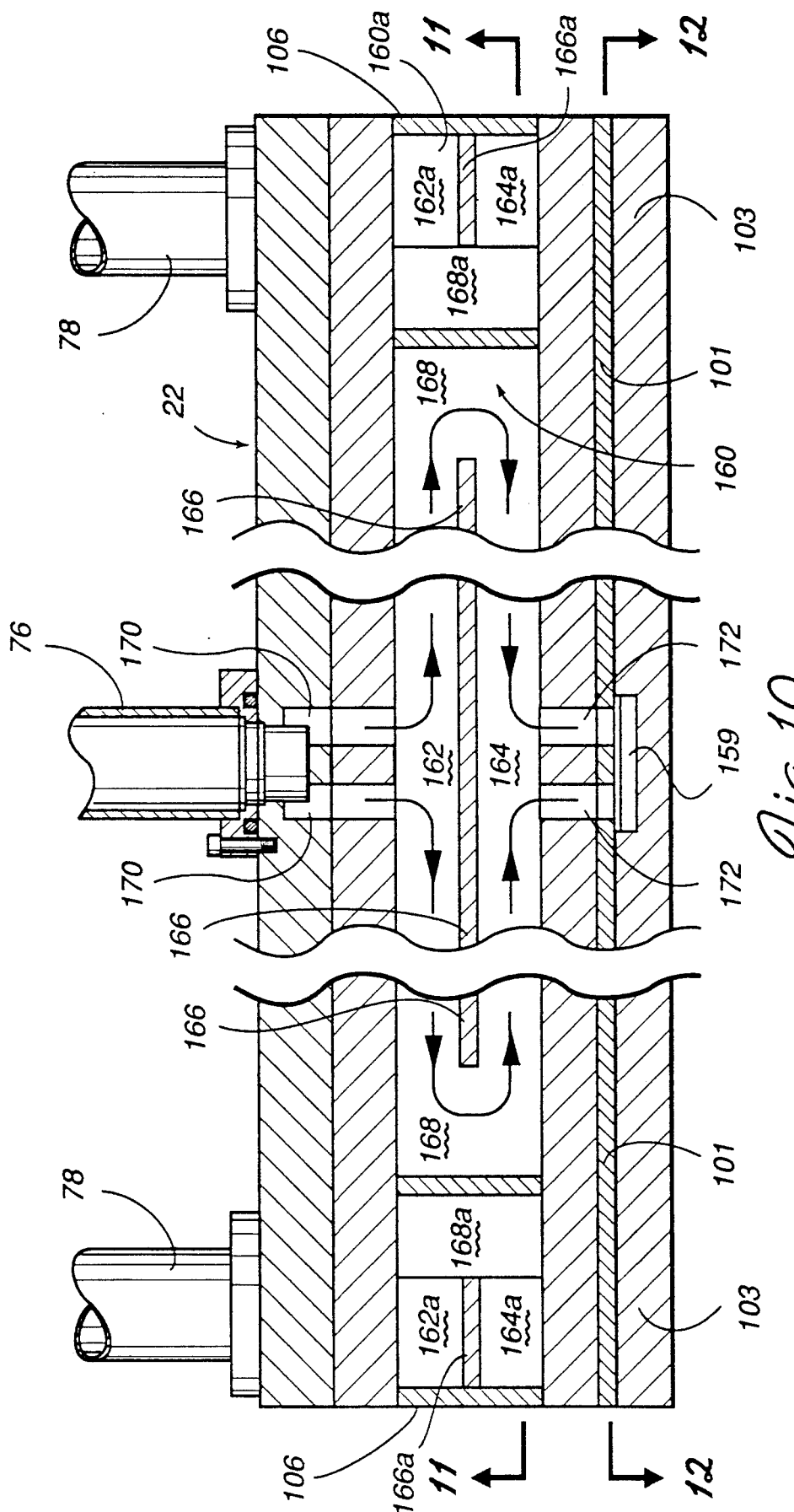
FIG. 10 is a cross-section view taken in the direction 10—10 of FIG. 3 schematically illustrating a baffle and plenum arrangement for providing fluid circulation according to the cooling-fluid circulation scheme of FIG. 9
Figure 11:
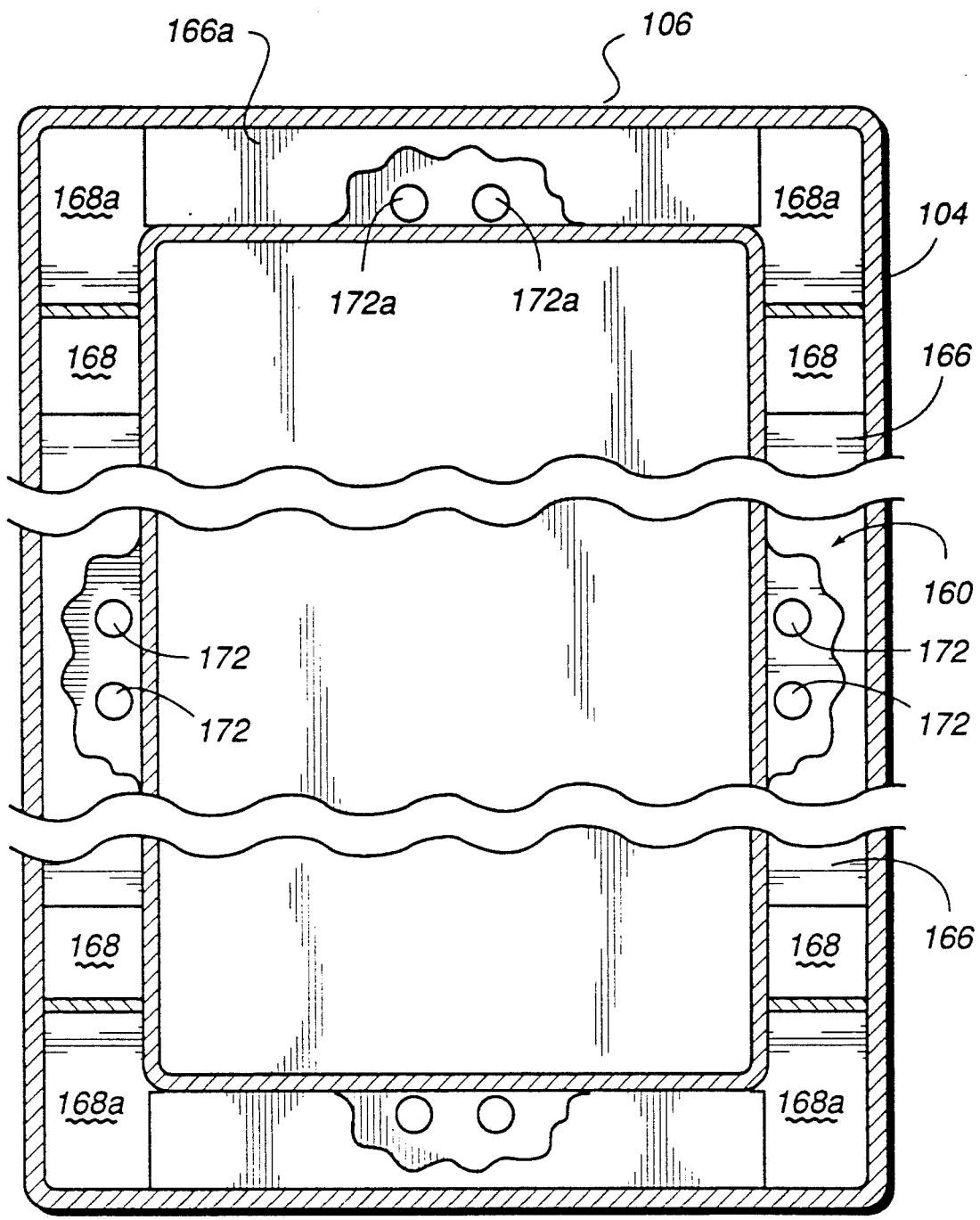
FIG. 11 is a view taken in the direction 11—11 of FIG. 10 schematically illustrating further details of the baffle and plenum arrangement of FIG. 10.
Figure 12:
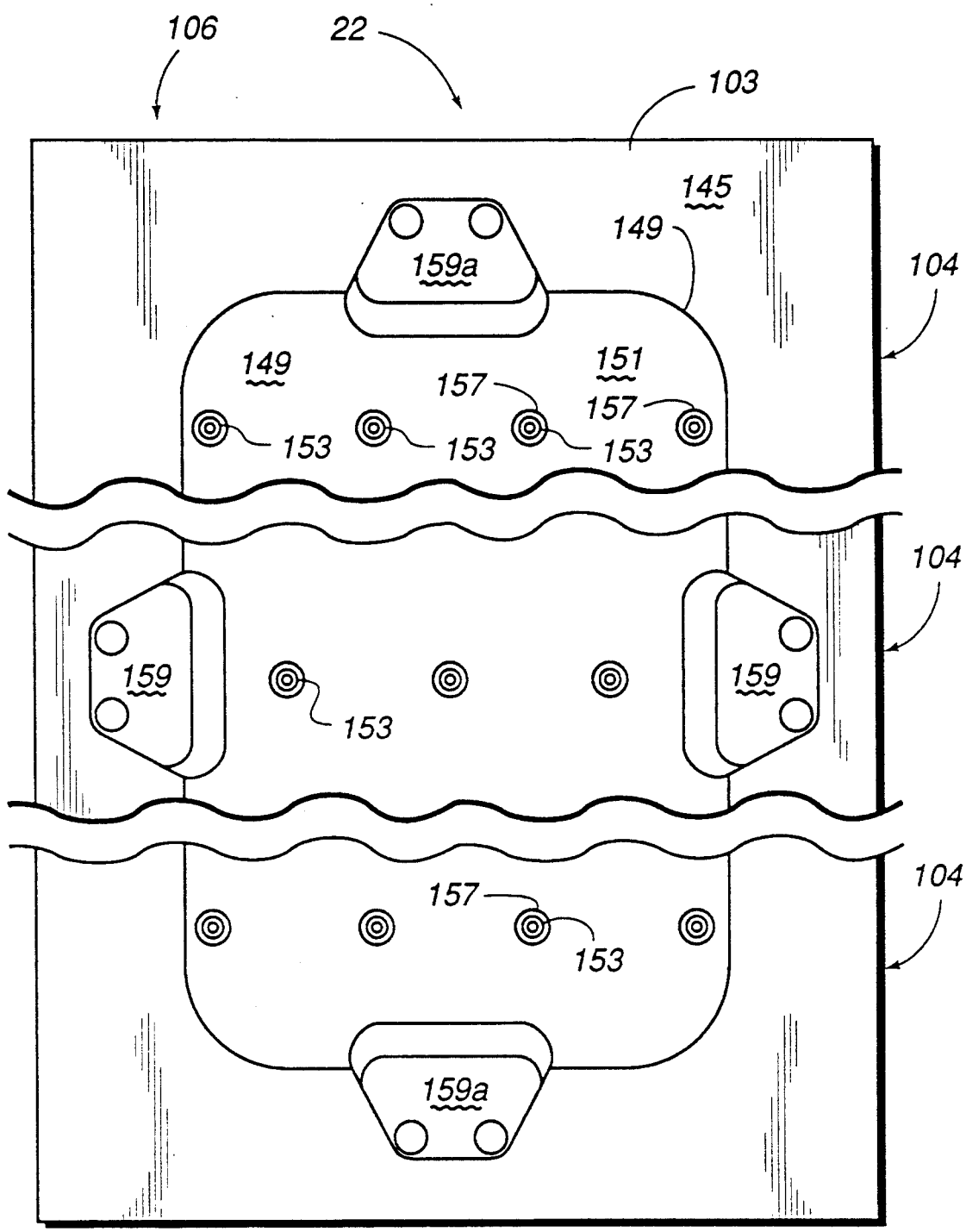
FIG. 12 is a sectional view taken in the direction 12—12 of FIG. 10 schematically illustrating water inlet plenums for flowing a cooling-fluid through a target-cooling space in a target-support member of the linear magnetron of FIG. 1.

Next, construction details of cathode body 22 and further details of the drive method for magnet-array 40 will be described with reference to FIGS. 4, 5, 6, and 10. Cathode body 22 includes a generally rectangular base 100 and a generally rectangular target-supporting member 102. Base 100 and target-supporting member 102 are attached to and spaced apart by two side-walls 104 and two end walls 106 (one is shown partially in FIG. 5, two are shown in FIG. 10). It is preferable that all major components of cathode body 22, in particular target-support member 102, be made from copper. This is effective in providing optimum electrical and thermal conductivity.

Within cathode body 22 spaced-apart, parallel, longitudinal-drive rails are attached to base 100 of cathode body 22. A magnet-array suspension-platform 112 is slidably mounted on rails 110 by linear bearings 114. Magnet-array 40 includes a magnet-array backing-plate or flux-return plate 118, having magnet-mounting strips 120 thereon. Pole pieces 120 support neodymium-iron (Nd-Fe) magnets 122 preferably arranged at an angle between about ten and fifty degrees from the horizontal. This angle is selected to provide broad as possible an erosion-zone on target 28.

Suspension-platform 112 includes spaced-apart, parallel, lateral-drive rails 124 extending in a direction across the width of cathode body 22. Magnet-array 40 is slidably mounted on lateral-drive rails 124 by linear bearings 126.

Figure 5:
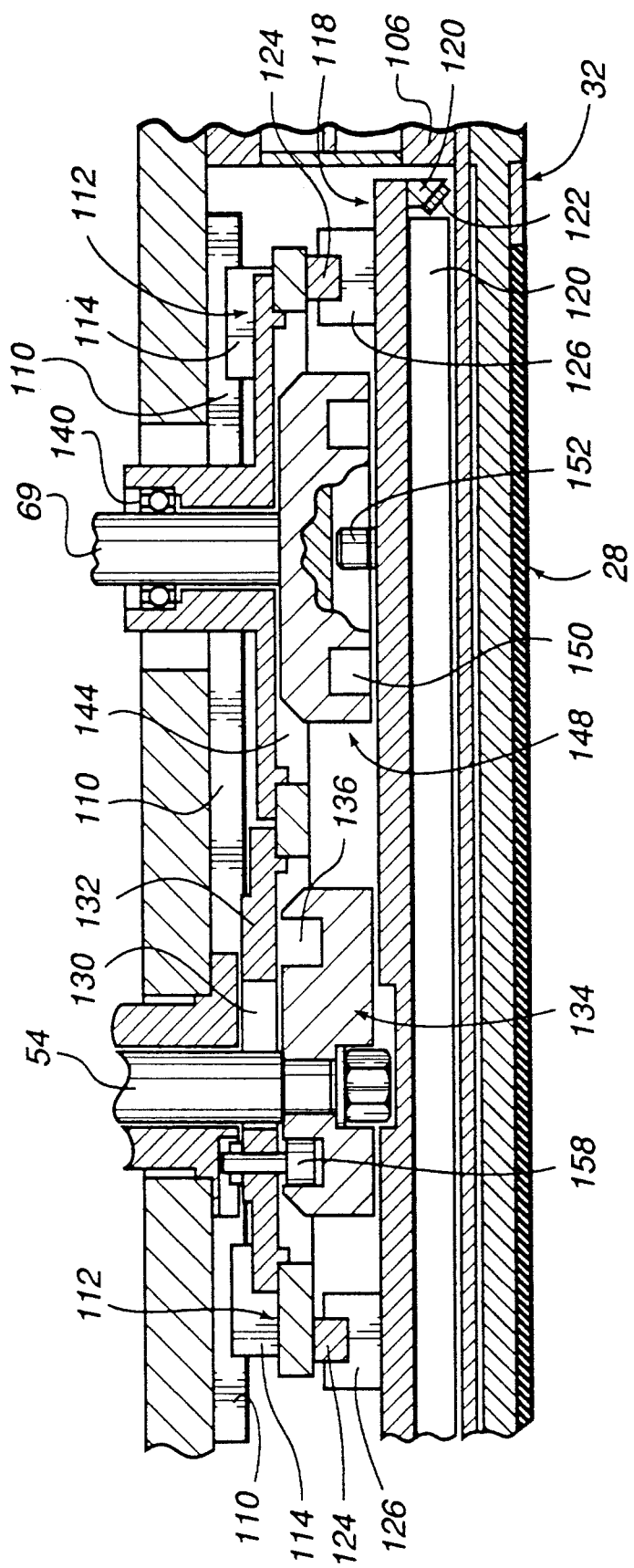
FIG. 5 is a cross-section view taken in the direction 5—5 of FIG. 2 schematically illustrating components of a reciprocal drive mechanism for the magnet-array of FIG. 4.

Continuing with reference to FIG. 5, longitudinal drive shaft 54 extends through an aperture 130 in a cam-roller insert 132. On one end of shaft 54 is a longitudinal eccentric-cam 134 including a generally parallel-sided circular groove 136. A cam roller 138 attached to cam-roller insert 132 engages groove 136. As shaft 54 is rotated, eccentric-cam 134 and groove 136 therein rotate eccentrically about the axis of shaft 54. As suspension-platform 112 is restrained from moving in a lateral direction, by longitudinal-drive rails 110 and linear bearings 114, rotation of shaft 54 causes suspension-platform 112 to move reciprocally in a direction along the length of cathode body 22. Those skilled in the art will appreciate that groove 136 in cam 143 may be configured to give constant velocity through the greater portion through the stroke of cam follower 138.

Figure 6:
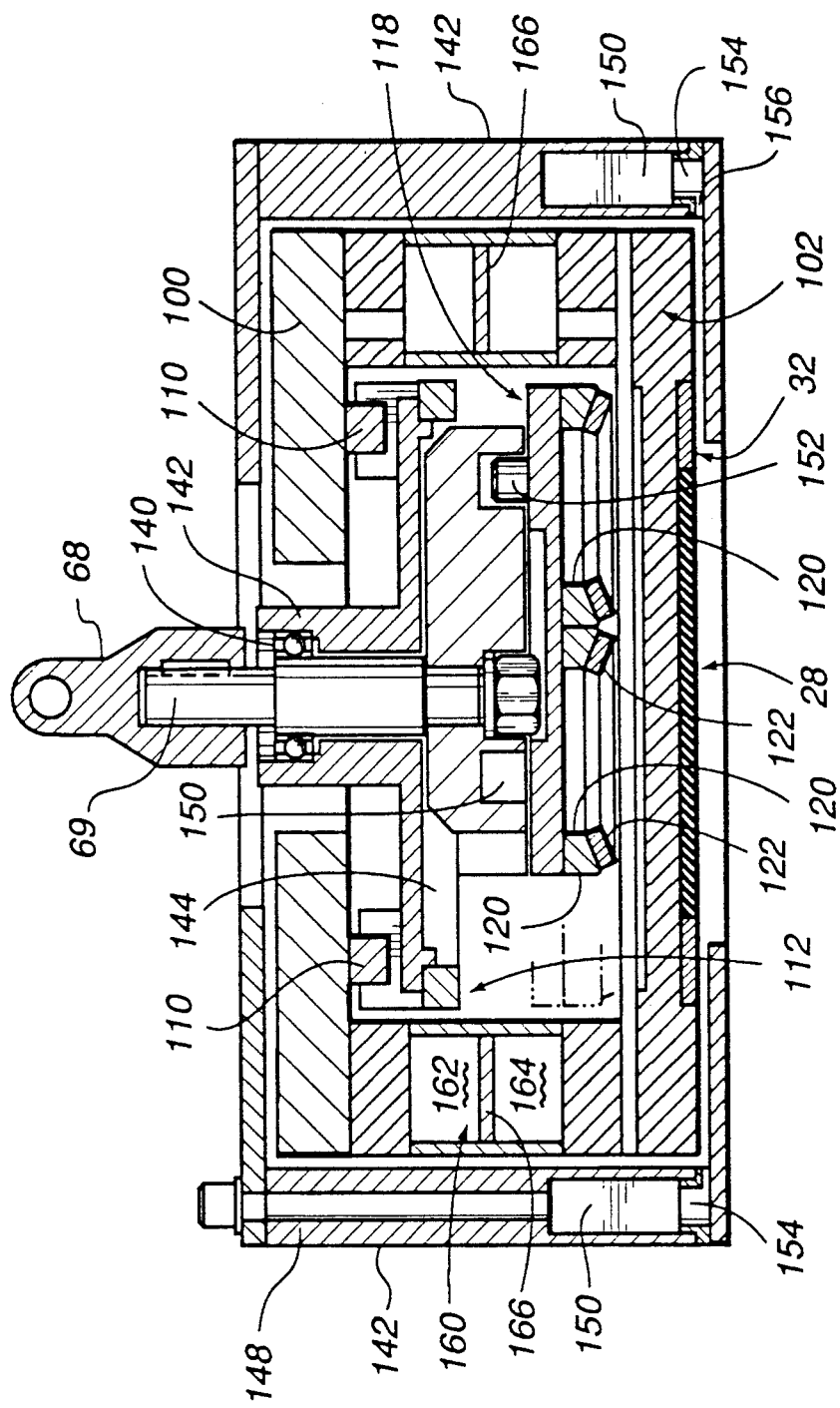
FIG. 6 is a cross-section view taken in the direction 6—6 of FIG. 2 schematically illustrating further details of the reciprocal drive mechanism of FIG. 5.
Figure 7:
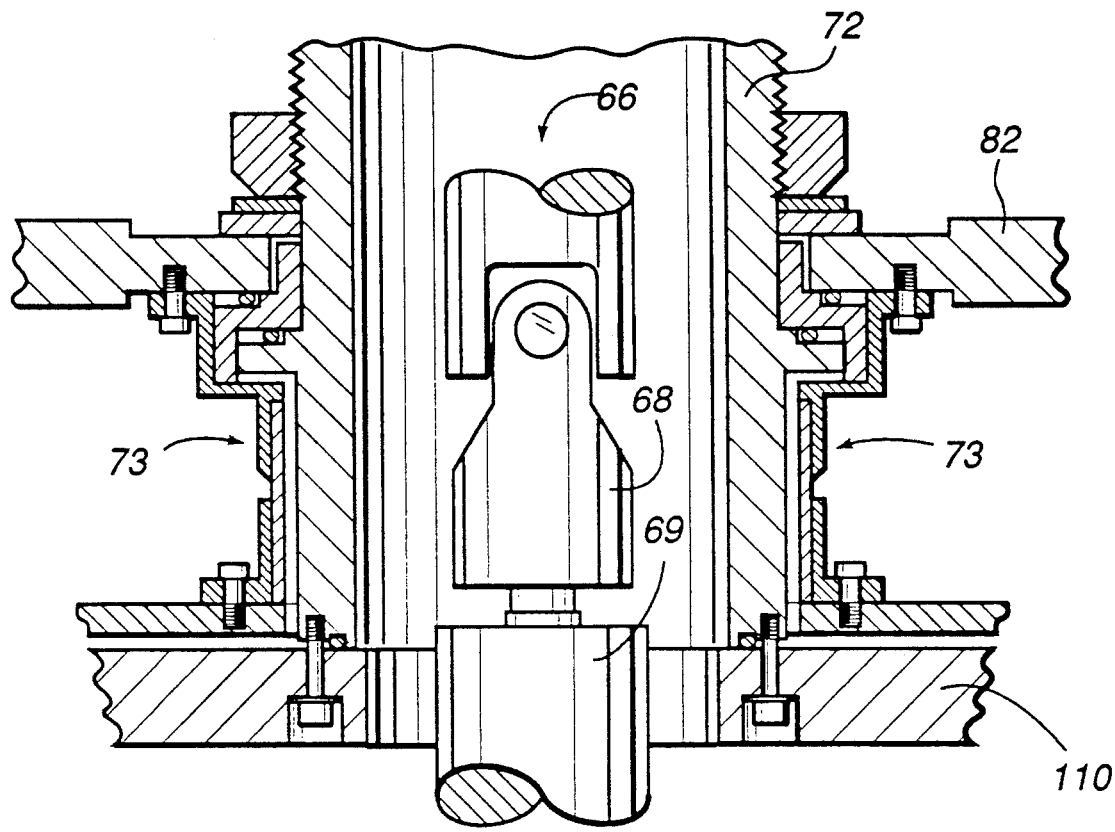
FIG. 7 is a cross-section view taken in the direction 6—6 of FIG. 2 schematically illustrating details of a universal drive mechanism for the reciprocal drive mechanism of FIG. 5

Referring now to FIGS. 5, 6 and 7, a shaft 69 attached to universal joint 68 extends through a roller bearing 140 in a housing 142. Housing 142 is mounted in an aperture 144 in suspension-platform 112. Mounted on one end of shaft 69 is a lateral eccentric-cam 148 including a generally parallel-sided circular groove 150. A cam roller 152 attached to flux-return plate 118 engages groove 136. As shaft 69 is rotated, eccentric-cam 148 and groove 150 therein rotate eccentrically about the axis of shaft 69. As flux-return plate 118 is restrained from moving in a longitudinal direction with respect to suspension-platform 112, by lateral-drive rails 124 and linear bearings 126, rotation of shaft 69 causes flux-return-plate 118 to move reciprocally in a direction across the width of cathode body 22. It will be evident from the foregoing that the function of universal drive assembly 66 (see FIG. 1) is to follow the longitudinal motion of suspension-platform 112 and thus shaft 69. There is a splined connection (not shown) between shaft 69 and universal joint 68 to compensate for length change of universal drive 66 during longitudinal motion of the magnet array.

It is pointed out that FIG. 7 in addition to showing details of universal drive 66 shows in detail, a dark-space shield arrangement designated by the general numeral 73, surrounding sealing tube 72. This detail is depicted here for completeness and consistency and will be understood from the drawing by those having skill in the art to which the present invention pertains. A detailed written description of this arrangement is not necessary for understanding principles of the present invention and, accordingly, is not presented here.

Shaft 54 is preferably rotated at between about two and one-hundred-twenty revolutions per minute (2 rpm and 120 rpm) and shaft 69 is preferably rotated at between about 2 rpm and 120 rpm. For a target 28 having dimensions about 0.72 meters (m) by 0.11 m, magnet-array 40 is preferably arranged to have a lateral motion of about plus or minus 2.5 millimeters (mm) about a nominal mid-point, and a longitudinal motion of about plus or minus 12.5 mm about a nominal mid-point.

As discussed above, a problem encountered when depositing silicon dioxide by DC reactive-sputtering of silicon is arcing due to build up of silicon dioxide on a dark-space shield, particularly in the gap between shield and cathode. One preventative measure already described is to surround the silicon target with a titanium strip. An additional measure, particularly effective in keeping the dark-space gap free of build-up, is to admit sputtering-gas into the sputtering chamber via the dark-space shield and through the dark-space gap between shield and cathode.

Figure 8:
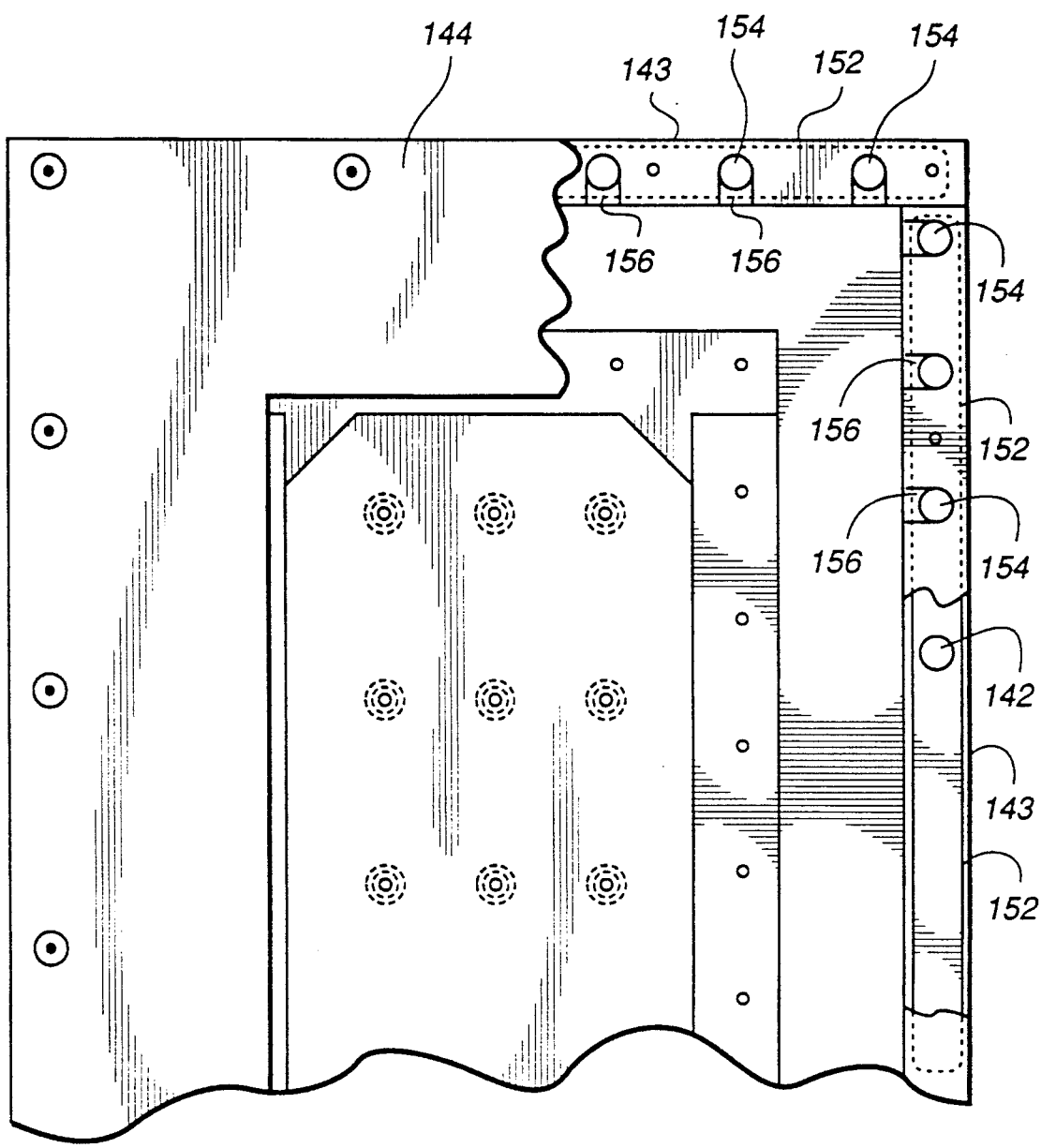
FIG. 8 is a partial cut-away view taken in the direction 3—3 of FIG. 2 schematically illustrating an arrangement of gas inlet plenums and jets in a dark-space shield.

Referring again to FIG. 4 and, additionally, to FIG. 8 one method of introducing sputtering-gas via a dark-space shield is illustrated. Here, dark-space shield 24 comprises a base 140, two side-walls 142, two end-walls 143 (see FIG. 8) and a target-shield 144 attached to the side-walls and end-walls. Dark-space shield 24 is attached to cathode body 22 by screws 139. The screws are passed through insulated bushings 137 in dark-space shield base 140 and screwed into base 100 of cathode body 142. Target-shield 144 surrounds and partially covers, (leaving target 28 exposed) a surface 146 of target-supporting member 102 leaving a gap 147 therebetween of about 3.0 mm. Within side-walls 142 are a plurality of conduits 148. Each conduit 148 is in communication with one elongated manifold 150. Referring in particular to FIG. 8, side-walls 142 each include five manifolds, and end-walls 143 each include one manifold. The length of the manifolds is indicated in FIG. 8 by line 152 (shown partially in phantom).

Continuing with reference to FIGS. 4 and 8, a plurality of spaced apart nozzles or jets 154 is located at the junction of side-walls 142 and end-walls 143 with target-shield 144. Each manifold preferably includes eight such nozzles. Each nozzle 154 has an orifice 156 for directing a gas into gap 147.

A sputtering-gas, for example argon, is introduced into plenums 150 via conduits 148 and then passed from plenums 150 via orifices 156 in to gap 147. Sputtering-gas pressure in gap 147 is higher than the ambient gas pressure in a vacuum chamber in which magnetron 20 is mounted. Because of this, gas escapes from gap 147 into the vacuum chamber with a velocity sufficient that molecules of material, sputtered from target 28, which may be drifting toward the gap are driven away from the gap by the escaping sputtering-gas. The escaping sputtering-gas thus continuously sweeps gap 147 free of sputtered material and thus extends the time period over which magnetron 20 may be operated free of arcing.

It may be hypothesized, without being limited to any particular theory, that the presence of escaping gas in gap 147 will reduce the mean fee path of sputtered molecules form target 28. Because of this a sputtered molecules may collide with one or more escaping gas molecules before it can attach itself to components forming the dark-space gap.

As discussed above, a most important aspect in the realization of moving magnet magnetron is cooling. In the magnetron of the present invention, an area of the target about ninety percent of the total length and between about twenty and forty percent of the total width is sputtered at any given instant. Further it is desired that the magnetron be operated at the highest possible power to achieve cost-effective film deposition rates. Because of this it is preferable that essentially the entire area of target 28 be cooled during sputtering. Further, as magnets in magnet-array 40 may demagnetize if they reach a temperature in excess of fifty degrees centigrade (50° C.), it is also preferable that magnet-array 40 be kept cool during sputtering. An arrangement for providing target-cooling and magnet-cooling is next set forth below.

Figure 9:
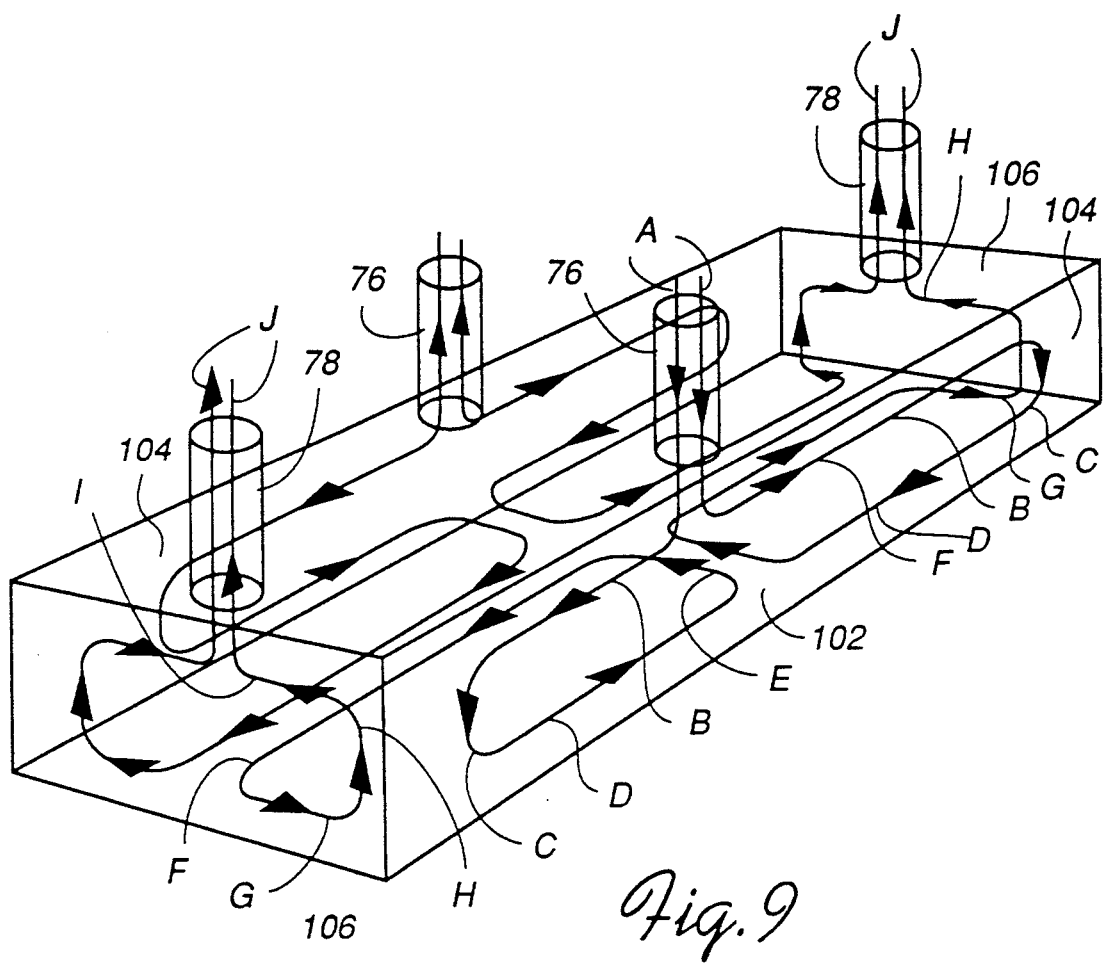
FIG. 9 schematically illustrates a cooling-fluid circulation scheme for the linear magnetron of FIG. 1.

Referring now to FIG. 9, a method for flowing a cooling fluid, i.e., a method for providing water cooling for magnetron 20 is described. Here, cooling-water is passed into cathode side-walls 104 via input conduits 76 as indicated by arrows A. The cooling-water is circulated through side-walls 104 by causing it to flow from the mid-point of the walls toward the end of the walls in an upper portion thereof (arrows B), and causing the cooling-water to return from the ends of the walls to the mid-point of the walls in a lower portion thereof (arrows C and D). The cooling-water is then flowed through target-supporting member 102 (arrows E and F) towards end-walls 106. On entering end-walls 106 the cooling-water is directed from a mid-point of the end-walls towards the end thereof in a lower portion of the walls (arrows G), and is then caused to return to the mid-point of the walls in an upper portion thereof (arrows I). Cooling-water exits cathode body 24 (end-walls 106) via exit conduits 78 (arrows J).

Details of how the above described cooling-water flow scheme is accomplished are set forth below with reference to FIGS. 4, 5, 6, 10, 11, and 12.

Target-supporting member 102 is constructed from two generally rectangular plates 101 and 103. Target 28 is supported by plate 103, on surface 146 thereof, in a predetermined area of surface 146 defined by a generally rectangular cut-out portion 99. On opposite surface 145 of plate 103 is located a generally rectangular cut-out area 149 having about the same dimension as cut-out 99 (see FIG. 12). Because of this, when plates 101 and 103 are assembled to form target-support member 102, a target-cooling space 151, for containing a flowing cooling-fluid, is formed therebetween. Plenums 159 provide a means of flowing a cooling-fluid into target-cooling space 151 and plenums 159a provide a means of flowing the cooling-fluid out of target-cooling space 151.

Within target-cooling space 151, plates 101 and 103 are spaced apart by raised protrusions 153 and secured together by screws 155 passing through the protrusions (see FIG. 4). Each raised protrusions 153 is surrounded by a groove 157 to provide space for an O-ring seal (not shown) in the region of the raised protrusion. It has been determined that plates 101 and 103 may be effectively spaced and supported when raised protrusions 153 are circular in section have a diameter of about 3.2 mm, and are spaced on 32 mm centers. This provides that less than about one percent (1.0 %) of target-cooling space 151 is occupied by raised protrusions 153. As such, target-cooling space 151 may be defined as extending continuously within target support member 102 in an area thereof having generally the same rectangular dimension as, and aligned with, the area thereof covered by target 28.

Those skilled in the art will appreciate that methods other than the method described above may be used to assemble plates 101 and 103. For example the plates may be electron beam welded together at spaced-apart points corresponding generally to the location of raised protrusions 153

Side walls 104 of cathode body 22 each include an elongated chamber 160. End walls 106 include a similar chamber 160a. Each chamber 160 is divided into an upper elongated sub-chamber 162 and a lower elongated sub-chamber 164 by a baffle 166. Similarly each chamber 160a is divided into an upper elongated sub-chamber 162a and a lower elongated chamber 164 by a baffle 166a. Baffles 166 and 166a extends towards the ends of chambers 160 and 160a leaving spaces 168 and 168a respectively, free at each end of the chamber. This permits each upper sub-chamber 162 and 162a to be in fluid communication with adjacent lower sub-chamber 164 and 164a respectively, at adjacent ends of the sub-chambers.

Each upper sub-chamber 162, (and thus chamber 160) of side-walls 104 is in fluid communication, at a mid-point between the ends of the sub-chamber, with input conduit 76 via two bores 170. Each lower sub-chamber 164 of side-walls 104 (and thus chamber 160) is in fluid communication, via plenum 159, with target-cooling space 151 at a mid-point between the ends of the sub-chamber 164 via two bores 172. Similarly, each upper sub-chamber 162a, (and thus chamber 160a) of end-walls 106 is in fluid communication, at a mid-point between the ends of the sub-chamber, with output conduit 78 via two bores 170. Each lower sub-chamber 164 of end-walls 106 (and thus chamber 160a) is in fluid communication, via plenum 159a, with target-cooling space 151, via two bores 172, at a mid-point between the ends of the sub-chamber 164a.

In order to improve cooling efficiency of target-cooling space 151, it is desirable to flow cooling-fluid through the space at a relatively high flow-velocity. Preferable the flow-velocity of a cooling-fluid at any point in cooling space 151 should be greater than about fifteen meters per sec (15 m/sec). To facilitate a high flow velocity the height of target-cooling space 151, i.e., the spacing of plates 101 and 103, should be less than about 2.5 mm and preferably about 1.5 mm. By way of example, for a cathode body having rectangular dimensions of about 0.15 m by 0.76 m and a target-cooling space having a rectangular dimension of about 0.11 m by 0.72 m: input conduits 76 and output conduits 78 preferably have an inside diameter of about 25 mm; bores 170 and 172 (see FIG. 10) preferably have diameter of 12.5 mm; and target-space 151 preferably has a height of about 1.5 mm; Given the foregoing dimensions, if water is input into input conduits 76 at a combined volume flow-rate of thirty liters per minute (l/m), the minimum flow-velocity of water in target-cooling space 151 will be about 5.0 m/sec. If the thickness of plate 103 between target-cooling space 151 and target 28 is about 12.5 mm this minimum flow-rate may provide effective cooling when the magnetron is operated at a power of about thirty kilowatts (30 KW).

The above-described cooling scheme for the magnetron of the present invention has been described in terms of admitting cooling-fluid to the cathode body via side-walls for cooling the side-walls; flowing the cooling-fluid from the side-walls through a target-cooling space in a target-supporting member for cooling a target; flowing the cooling-fluid from the target-cooling space to end-walls for cooling the end-walls; and removing the cooling-fluid from the end-walls. The above-described cooling scheme is designed to be effective in cooling a target during sputtering, and also for providing a cooled, dry enclosure for a moving magnet-array within the cathode body.

It will be evident to those familiar with the pertinent art that other cooling-fluid flow schemes may be more or less effective in cooling the target and providing a cooled dry enclosure for the magnet-array. For example: cooling-fluid may be flowed in to the end-walls, through the target-cooling space, and out of the side walls. Alternatively, instead of including wall-cooling and target-cooling means in a single cooling-fluid circuit, as described above, separate cooling circuits may be provided for the target-supporting member and the side and end-walls.

In summary, a linear magnetron sputtering cathode including a reciprocating magnet-array has been described. The magnetron may be mounted in a coating chamber under vacuum. The magnet-array is movably supported in a dry enclosure at atmospheric pressure within a cathode body. The cathode body has a rectangular box-like shape and includes two side-walls, and two end-walls attached to a base and a target-supporting member. The target-supporting member has a predetermined generally rectangular area on one surface thereof for supporting the target. The target-supporting member includes a target-cooling space extending continuously under the target-supporting area. The side-walls and end-walls include chambers for circulating a cooling-fluid within them. Together the target-cooling member, the side-walls, and the end-walls form a cooled enclosure for the magnet-array for cooling the magnet-array during sputtering.

The present invention has been described in terms of a preferred embodiment and a number of other embodiments. The invention however is not limited to the embodiments described and depicted. Rather, the scope of the invention is defined by the appended claims.

What is claimed is:

1. A linear planar-magnetron sputtering apparatus, comprising:

A rectangular box-shaped cathode body having a length and a width;

said cathode body including a flat, rectangular base and a flat, rectangular target-supporting member, said base and said target-supporting member attached to and spaced apart by first and second side-walls, and first and second end-walls, and said base, said target supporting member and said side and end-walls forming an enclosure within said cathode body;

magnetic means within said enclosure for defining an elongated sputtering-zone extending along the length of said-target-supporting member, said magnetic means including a magnet array attached to a flux-return plate;

said target-supporting member arranged to support on an outer surface thereof a target material to be sputtered, said target material in contact with a predetermined rectangular target area of said outer surface;

magnet-moving means for providing reciprocal motion of said magnetic means in at both lateral and longitudinal directions relative to said cathode body;

said magnet-moving means including spaced-apart parallel longitudinal-drive rails attached to said rectangular base and extending in a direction along the length of said cathode body, a magnet-array suspension-platform slidably mounted on said longitudinal drive rails, said suspension-platform having spaced-apart, parallel, lateral-drive rails extending in a direction across the width of said cathode body, and said magnet-array slidably mounted on said lateral-drive rails;

at least one rotatable longitudinal-drive shaft having first cam means attached thereto, said first cam means slidably engaging first cam-follower means attached to said suspension platform, and at least one rotatable lateral-drive shaft, said lateral-drive shaft having second cam means attached thereto said second cam means slidably engaging second cam-follower means attached to said flux-return plate;

target cooling means within said target-supporting member for cooling a target during sputtering;

side-wall cooling means within said side-walls, and end-wall cooling means within said end-walls for cooling said side-walls and said end-walls respectively during sputtering; and means for mounting said cathode body in a vacuum chamber under vacuum, with said magnet-array and said reciprocal motion providing means at atmospheric pressure.

2. The magnetron of claim 1 wherein said target-cooling means includes a rectangular target-cooling space having an area about equal to said target area, and aligned therewith.

3. The magnetron of claim 2 wherein said side-wall and end-wall cooling means include an elongated rectangular side-wall chamber in each of said side-walls, and an elongated end-wall chamber in each of said end-walls, each of said side-wall chambers and said end-wall chambers in fluid communication with said target-cooling space.

4. The magnetron of claim 3 wherein each of said side-walls includes an input conduit in fluid communication with the chamber therein and each of said end-walls includes an output conduit in fluid communication with the chamber therein, whereby a cooling-fluid may be flowed into said target-cooling space via said input conduits and said side-wall chambers and flowed out of said target-cooling space via said end-wall chambers and said output conduits.

5. The magnetron of claim 4 wherein said side-wall chambers and said end-wall chambers each include means for circulating a cooling-fluid therein.

6. A linear planar-magnetron sputtering apparatus, comprising:

a hollow, rectangular, box-shaped cathode body;

said cathode body including a flat rectangular base, and a flat rectangular target-supporting member, said base and said target-supporting member attached to and spaced apart by first and second side-walls, and first and second end-walls;

magnetic means within said cathode body for defining and elongated sputtering-zone extending along the length of said target-supporting member;

means for providing reciprocal motion of said magnetic means in at least one direction relative to said cathode body;

said target-supporting member including first and second rectangular, parallel plates, each thereof having first and second opposite surfaces and said first plate having on said first surface thereof a rectangular target-area for supporting a target material to be sputtered, said plates arranged, spaced apart, with said second surfaces thereof in a face-to-face relationship to define a rectangular target-cooling space therebetween, said target-cooling-space having about the same area as said target area and aligned therewith;

each of said side-walls including a side-wall cooling-chamber having input-conduit means in fluid communication therewith and each of said end-walls including an end-wall cooling-chamber having output-conduit means in fluid communication therewith;

each of said side-wall cooling-chambers having an elongated rectangular shape and including a baffle, said baffle arranged to divide said cooling-chamber into first and second elongated rectangular sub-chambers each thereof having first and second ends, and said first and second sub-chambers in fluid communication with each other at adjacent ends thereof;

in each of said side-walls, said input-conduit means being in fluid communication with said first sub-chamber therein at a point about midway between the ends thereof, and said target-cooling space being in fluid communication with said second sub-chamber therein at a point about midway between the ends thereof; and in each of said end-walls, said output-conduit means being in fluid communication with said first sub-chamber therein at a position about midway between the ends thereof and said target-cooling space being in fluid communication with said second sub-chamber therein at a position about midway between the ends thereof 7. The apparatus of claim 6 wherein said first and second plates of said target supporting member are spaced apart by less than about 2.5 millimeters.

8. The apparatus of claim 7 wherein said first and second plates of said target supporting member are spaced apart by about 1.0 millimeter.

9. The apparatus of claim 6 wherein said first and second plates of said target supporting member are spaced apart by a plurality of raised protrusions extending from said second plates, said raised protrusions occupying less than about 1.0 percent of said target cooling space.

* * * * *